United States Patent
Basim et al.

(10) Patent No.: US 9,218,981 B2
(45) Date of Patent: Dec. 22, 2015

(54) HYDROGEN PASSIVATION OF INTEGRATED CIRCUITS

(71) Applicant: Texas Instruments Incorporated, Dallas, TX (US)

(72) Inventors: Gul B. Basim, Mountain View, CA (US); Scott R. Summerfelt, Garland, TX (US); Ted S. Moise, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/066,298

(22) Filed: Oct. 29, 2013

(65) Prior Publication Data
US 2014/0051234 A1 Feb. 20, 2014

Related U.S. Application Data

(62) Division of application No. 13/396,420, filed on Feb. 14, 2012, now abandoned, which is a division of application No. 12/890,137, filed on Sep. 24, 2010, now Pat. No. 8,669,644.

(60) Provisional application No. 61/249,482, filed on Oct. 7, 2009.

(51) Int. Cl.
*H01L 21/30* (2006.01)
*H01L 21/02* (2006.01)
*H01L 21/768* (2006.01)
*H01L 29/66* (2006.01)
*H01L 29/78* (2006.01)

(52) U.S. Cl.
CPC ........ *H01L 21/3003* (2013.01); *H01L 21/0217* (2013.01); *H01L 21/02274* (2013.01); *H01L 21/76829* (2013.01); *H01L 21/76832* (2013.01); *H01L 29/6659* (2013.01); *H01L 29/7833* (2013.01)

(58) Field of Classification Search
CPC ....................... H01L 21/3003; H01L 21/76829
USPC ........... 438/761, 778, 791, 308; 257/E21.212
See application file for complete search history.

(56) References Cited

U.S. PATENT DOCUMENTS 3,923,559 A * 12/1975 Sinha ............................. 438/12
4,271,582 A *  6/1981 Shirai et al. .................. 438/301
4,933,206 A     6/1990 Cox
(Continued)

FOREIGN PATENT DOCUMENTS

JP   H08045926 A   2/1996
JP   2002016246 A  1/2002
(Continued)

OTHER PUBLICATIONS

Boehme et al., "Dissociation reactions of hydrogen in remote plasma-enhanced chemical-vapor-deposition silicon nitride." American Vacuum Society (2001): pp. 2622-2628.

*Primary Examiner* — Michele Fan
(74) *Attorney, Agent, or Firm* — Rose Alyssa Keagy; Frank D. Cimino

(57) ABSTRACT

An integrated circuit with a passivation trapping layer. An integrated circuit with a hydrogen or deuterium releasing layer underlying a passivation trapping layer. Method for forming an integrated circuit having a hydrogen or deuterium releasing layer. Method for forming an integrated circuit having a passivation trapping layer.

7 Claims, 11 Drawing Sheets

(56) References Cited

U.S. PATENT DOCUMENTS

| | | | |
|---|---|---|---|
| 5,674,759 A | 10/1997 | Jung | |
| 5,711,998 A | 1/1998 | Shufflebotham | |
| 5,793,110 A * | 8/1998 | Yamaha et al. | 257/750 |
| 5,815,223 A | 9/1998 | Watanabe et al. | |
| 6,150,692 A | 11/2000 | Iwanaga et al. | |
| 6,248,673 B1 * | 6/2001 | Huang et al. | 438/787 |
| 6,277,678 B1 * | 8/2001 | Lee | 438/151 |
| 6,323,068 B1 | 11/2001 | Seo | |
| 6,372,569 B1 | 4/2002 | Lee et al. | |
| 6,534,358 B2 | 3/2003 | Nakura et al. | |
| 6,781,184 B2 | 8/2004 | Solayappan et al. | |
| 6,991,951 B2 | 1/2006 | Nishio et al. | |
| 7,087,507 B2 | 8/2006 | Koldiaev et al. | |
| 7,098,085 B2 | 8/2006 | Yamanaka et al. | |
| 7,638,352 B2 | 12/2009 | Sawayama et al. | |
| 7,749,827 B2 | 7/2010 | Kim | |
| 7,985,603 B2 | 7/2011 | Celii et al. | |
| 8,212,300 B2 | 7/2012 | Nagai | |
| 8,384,190 B2 | 2/2013 | Summerfelt | |
| 8,497,537 B2 | 7/2013 | Wang et al. | |
| 2002/0000664 A1 * | 1/2002 | Cheng et al. | 257/758 |
| 2002/0045339 A1 * | 4/2002 | Yamaha | 438/643 |
| 2002/0130355 A1 * | 9/2002 | Takeuchi et al. | 257/315 |
| 2002/0153537 A1 * | 10/2002 | Segawa | 257/202 |
| 2003/0085414 A1 * | 5/2003 | Okuno et al. | 257/200 |
| 2004/0178429 A1 * | 9/2004 | Tanaka | 257/288 |
| 2004/0238820 A1 | 12/2004 | Sakama et al. | |
| 2005/0009210 A1 | 1/2005 | Hosotani | |
| 2005/0032320 A1 | 2/2005 | Yokoyama | |
| 2005/0202686 A1 | 9/2005 | Saki et al. | |
| 2005/0255684 A1 * | 11/2005 | Koldiaev et al. | 438/528 |
| 2006/0006387 A1 * | 1/2006 | Yeh et al. | 257/66 |
| 2006/0113615 A1 * | 6/2006 | Lee et al. | 257/410 |
| 2007/0096157 A1 * | 5/2007 | Nabatame et al. | 257/213 |
| 2007/0134817 A1 | 6/2007 | Noda | |
| 2007/0161258 A1 | 7/2007 | Nam et al. | |
| 2007/0212804 A1 | 9/2007 | Sasaki et al. | |
| 2008/0157380 A1 * | 7/2008 | Hong | 257/751 |
| 2008/0179690 A1 * | 7/2008 | Takeoka | 257/384 |
| 2008/0206983 A1 * | 8/2008 | Sawayama et al. | 438/627 |
| 2008/0303020 A1 * | 12/2008 | Shin et al. | 257/43 |
| 2009/0011583 A1 * | 1/2009 | Hong et al. | 438/586 |
| 2009/0023285 A1 * | 1/2009 | Kim | 438/618 |
| 2009/0095993 A1 * | 4/2009 | Ozaki et al. | 257/295 |
| 2009/0117692 A1 * | 5/2009 | Koyama et al. | 438/164 |
| 2009/0181552 A1 * | 7/2009 | Shimomura et al. | 438/795 |
| 2010/0022961 A1 | 1/2010 | Dewey et al. | |
| 2010/0224961 A1 | 9/2010 | Summerfelt et al. | |
| 2011/0079878 A1 | 4/2011 | Aggarwal et al. | |

FOREIGN PATENT DOCUMENTS

| | | |
|---|---|---|
| JP | 2003224206 A | 8/2003 |
| JP | 2008210864 A | 9/2008 |
| JP | 2009289919 A | 12/2009 |

* cited by examiner

HYDROGEN PASSIVATION OF INTEGRATED CIRCUITS

CROSS-REFERENCE TO RELATED APPLICATIONS

This is a divisional of U.S. application Ser. No. 13/396,420 filed Feb. 14, 2012 which is a divisional of U.S. application Ser. No. 12/890,137, filed on Sep. 24, 2010, which claims the benefit of priority under U.S.C. §119(e) of U.S. Provisional Application 61/249,482, filed Oct. 7, 2009, all of which are incorporated herein by reference.

Moreover, this application is related to patent application Ser. No. 12/890,219, filed Sep. 24, 2010) entitled "Ferroelectric Capacitor Encapsulated with a Hydrogen Barrier" and patent application Ser. No. 12/717,604, filed Mar. 4, 2010) entitled "Passivation of Integrated Circuits Containing Ferroelectric Capacitors and Hydrogen Barriers". With their mention in this section, these patent applications are not admitted to be prior art with respect to the present invention.

BACKGROUND

These embodiments relate to the field of integrated circuits. More particularly, these embodiments relate to the hydrogen passivation of integrated circuits.

DETAILED DESCRIPTION

Figure 1:
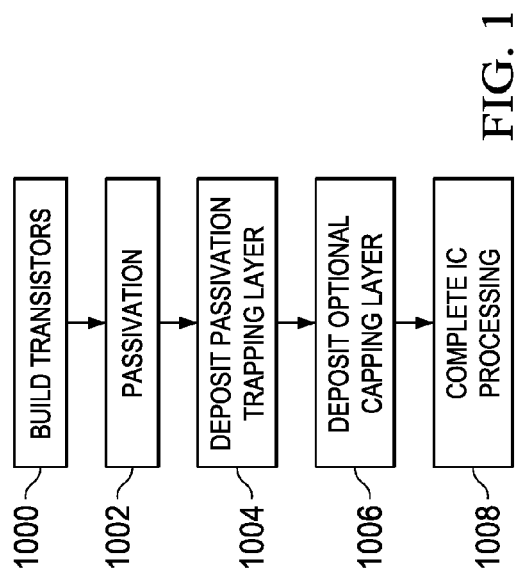
FIG. 1 is a flow diagram of process steps for forming an integrated circuit according to an embodiment.

The example embodiments are described with reference to the attached figures, wherein like reference numerals are used throughout the figures to designate similar or equivalent elements. The figures are not drawn to scale and they are provided merely to illustrate the example embodiments. Several aspects are described below with reference to example applications for illustration. It should be understood that numerous specific details, relationships, and methods are set forth to provide a full understanding of the example embodiments. One skilled in the relevant art, however, will readily recognize that the example embodiments can be practiced without one or more of the specific details or with other methods. In other instances, well-known structures or operations are not shown in detail to avoid obscuring the embodiment. The example embodiments are not limited by the illustrated ordering of acts or events, as some acts may occur in different orders and/or concurrently with other acts or events. Furthermore, not all illustrated acts or events are required to implement a methodology in accordance with the example embodiments.

The threshold voltage ("$V_t$") of a transistor is generally defined as the gate voltage where an inversion layer forms at the interface between the substrate (body) and the gate dielectric. However, interface states located between the substrate and gate dielectric will generate an interface charge ("$Q_{it}$") that contributes to the transistor threshold voltage. Therefore, variations in $Q_{it}$ may cause variations in $V_t$. One method for passivating this interface charge is anneal at a temperature of approximately 400° C. in a hydrogen ambient that is usually one of the last steps in an integrated circuit process flow.

An earlier step in an integrated circuit process flow is the formation of the gate dielectric of a CMOS transistor. This step typically begins with an oxidation of the single crystal silicon surface of the substrate. As the oxide is grown on the silicon surface, silicon atoms are removed from the single crystal silicon surface to form an amorphous layer of silicon dioxide. When the oxidation is stopped, some ionic silicon and some incomplete silicon bonds remain at the interface region, thereby forming a sheet of positive charge called interface trap charge or $Q_{it}$. The gate dielectric (may be composed of pure silicon dioxide, nitrided silicon dioxide, or a high-k dielectric) is deposited on the thin silicon dioxide layer.

Other processes in the integrated circuit manufacturing flow (such as plasma depositions and plasma etches) may break the weak bonds at the interface, thereby causing additional $Q_{it}$ to form. This charge may be variable across a substrate and may also be unstable. Because this charge may contribute to a transistor's $V_t$, any variability of $Q_{it}$ across a substrate may also cause $V_t$ variability; resulting in transistor instability.

Moreover, integrated circuit manufacturing processes may also cause crystal defects to occur near the substrate surface. A crystal defect in the depletion region of a transistor's PN junction may cause increased diode leakage.

One way to reduce the magnitude and instability of the interface charge (and to passivate crystal defects) is to perform a forming gas ($H_2+N_2$) anneal at approximately 400° C. late in the manufacturing flow. The hydrogen may react with the silicon ions and incomplete silicon bonds to form Si—H bonds, thus reducing and stabilizing the interface charge. The spread of a transistor's $V_t$ distribution is typically tightened with the passivation of the interface states, plus the stability of the $V_t$ distribution versus time may be significantly increased. Moreover, diode leakage and integrated circuit standby current may be reduced when the hydrogen reacts with incomplete silicon bonds along a crystal defect to form Si—H.

Hydrogen passivation of integrated circuits is becoming increasingly difficult with new technologies. For example, materials such as TaN that are used in forming interconnect layers may block the diffusion of the hydrogen to the interface. The increased number of interconnect layers also makes the diffusion path longer, thereby requiring more diffusion time to allow the hydrogen to reach the interface. In addition, some integrated circuit process flows (e.g. for ferroelectric memories) involve the formation of hydrogen barrier films (e.g. to prevent hydrogen from degrading the electrical properties of the ferroelectric capacitor). However, these hydrogen barrier films also prevent the hydrogen that is used in the forming gas anneal from reaching the interface.

Additionally, some materials being used in advanced process flows (such as metal gates and ultra low-k dielectric materials) may be degraded by a hydrogen anneal at 400° C. for an hour or more. While some digital integrated circuits may be able to still function with the increased transistor variation if the forming gas anneal is omitted, it may not be possible to omit the anneal from analog process flows (that may require tightly controlled transistor and component matching).

The term "passivation" refers to the reduction in $Q_{it}$ and the reduction in diode leakage that may occur during an anneal containing hydrogen or deuterium. A chemical reaction of hydrogen or deuterium with incomplete silicon bonds and silicon ions may occur at the interface between the single crystal silicon substrate and the amorphous layer silicon dioxide and also occur in the crystal defects near the substrate surface to form silicon-hydrogen ("Si—H") or silicon-deuterium ("Si-D") bonds, thereby reducing and stabilizing the interface charge. Prior to a forming gas anneal, the $Q_{it}$ density may be in the low $10^{11}$ cm$^{-2}$ eV$^{-1}$ range. After a forming gas anneal, the $Q_{it}$ density may be reduced to the low $10^{10}$ cm$^{-2}$ eV$^{-1}$ range. The deuterium isotope of hydrogen may be used instead of hydrogen for passivation to form Si-D bonds (that may be more stable than Si—H bonds).

FIG. 1 is a flow diagram of process steps for forming an integrated circuit according to an embodiment. After transistors are formed in the substrate (1000), the integrated circuit is passivated with an anneal (1002) and then a passivation trapping layer is deposited (1004). The trapping layer generally prevents the hydrogen or deuterium passivation from diffusing away from the transistors and interface region during subsequent thermal processing steps. An optional capping layer may then be deposited (1006) on top of the passivation trapping layer. In an example embodiment, a silicon nitride passivation trapping layer (formed with NH$_3$) is deposited on top of a substrate (containing transistors). Then an oxide capping layer is deposited on top of the silicon nitride passivation trapping layer. The silicon nitride passivation trapping layer and the oxide capping layer may prevent NH$_3$ from poisoning the photoresist that is used for a subsequent photoresist patterning step (such as the etch of pre-metal dielectric layer located over the transistors). Further processing (1008)—such as forming contacts to the transistors and the backend steps of forming the metal interconnect layers—then completes the integrated circuit.

The passivation step (1002) may be performed after silicidation of the transistor gates, sources, and drains but prior to any backend (post contact formation) processing steps that may be aversely affected by hydrogen. For example, if a FeCap is to be fabricated after contact formation, the passivation step and passivation trapping layer may be formed after contact formation and prior to FeCap formation. If a FeCap is to be formed after the formation of the first interconnect layer, the passivation step and passivation trapping layer may be formed on top of the first interconnect layer prior to FeCap formation. The passivation step (1002) of an example embodiment may be a hydrogen or deuterium anneal performed at 350° C. or higher with an HDP plasma containing H2 or D2, or the passivation step (1002) may be accomplished by depositing a hydrogen or deuterium releasing film. The hydrogen releasing film may be a silicon nitride film, for example, with a high concentration of silicon-hydrogen bonds. The passivation trapping layer formed in step (1004) may be a film such as AlOx, AlONx, SiNx, SiNxHy, AlN, or BN. In addition, the passivation trapping layer formed in step (1004) may be a silicon nitride film with a low concentration of Si—H bonds. Furthermore, the silicon nitride passivation trapping layer may contain a significant concentration of N—H bonds.

Figure 2A:
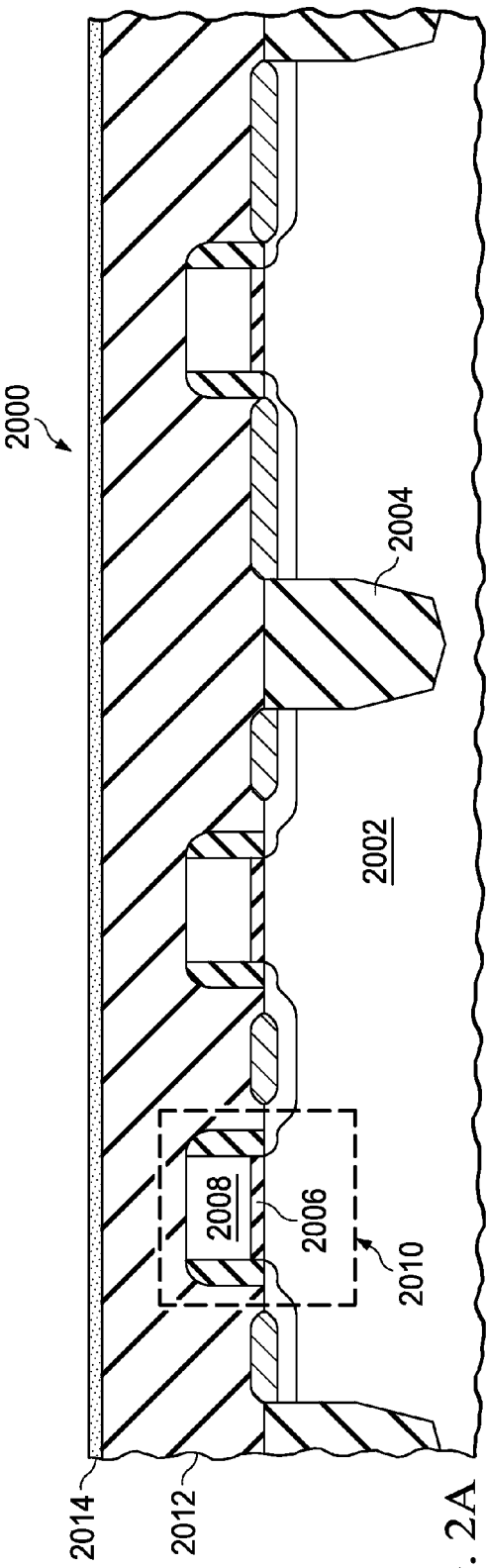
FIG. 2A through 2E illustrate steps in an integrated circuit process flow according to another embodiment.

FIGS. 2A through 2E illustrate the major processing steps of another embodiment. Although hydrogen passivation is used to illustrate this embodiment, deuterium passivation may instead be used FIG. 2A shows an integrated circuit (2000) that has been partially processed up to, but not including, contact photoresist patterning. The integrated circuit is formed on substrate (2002) and it includes shallow trench isolation regions (2004), transistors (2010) (having a transistor gate dielectric (2006) and a transistor gate (2008)), and pre-metal dielectric ("PMD") (2012). A hydrogen releasing layer (2014) has also been deposited over the integrated circuit for the passivation step of the example embodiment. In the example embodiment, the hydrogen releasing film is a SiNxHy film with a high concentration of Si—H bonds that is formed using a high density plasma ("HDP") process (although such a film may also be formed using a low density plasma). SiNxHy films typically contain hydrogen in the form of Si—H and N—H bonds. Si—H bonds are of lower bond energy (e.g. about 3.34 eV) than N—H bonds (e.g. about 4.05 eV). The hydrogen in high Si—H bond containing SiNxHy films may dissociate during backend (e.g. post contact formation) thermal processing steps (such as copper anneals) and thereafter become available for passivation. An example 8-inch HDP process for forming a SiNxHy hydrogen releasing film is given in Table 1 infra. Those skilled in the art may prepare an equivalent hydrogen releasing film using a different process such as PECVD.

TABLE 1

| Process Parameter | Value | Units |
|---|---|---|
| Low Frequency Power | 1850 | watts |
| Pressure | 15 | mTorr |
| Temperature | 400 | C. |
| SiH4 flow | 40 | sccm |
| N2 flow | 400 | sccm |
| Argon flow | 250 | sccm |

Figure 2B:
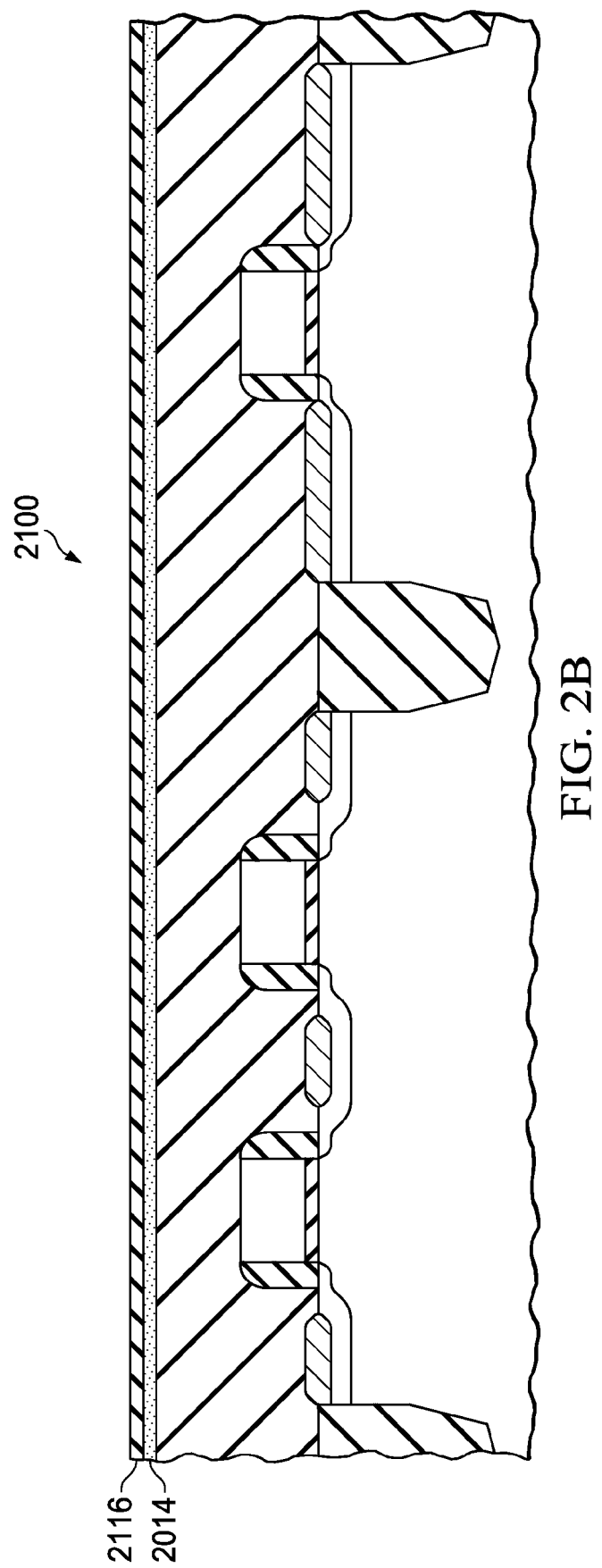

As shown n FIG. 2B, a hydrogen diffusion barrier layer (2116) is formed on top of the hydrogen releasing layer (2014) of the integrated circuit (2100) to function as a passivation trapping layer. More specifically, the hydrogen diffusion barrier layer (2116) generally prevents hydrogen from diffusing away from the interface and silicon crystal defects during subsequent thermal processing (resulting in depassification). The hydrogen diffusion barrier layer (2116) aids the retention of a high hydrogen concentration in close proximity to the transistor (2010) where it may passivate the interface states and crystal defects. The hydrogen barrier layer may be formed of one or more dielectric thin films, such as AlOx, AlONx, SiNx, SiNxHy, AlN, or BN. In the example embodiment, the hydrogen barrier layer is an SiNxHy film with most of the hydrogen in the form of N—H bonds. An example process for forming such a SiNxHy hydrogen barrier film using an 8-inch plasma enhanced chemical vapor deposition (PECVD) process is given in Table 2 infra. SiNxHy hydrogen barrier films may alternatively be prepared by one skilled in the art using other processes such as HDP.

TABLE 2

| Process Parameter | Value | Units |
|---|---|---|
| High Frequency Power | 700 | watts |
| Low Frequency Power | 100 | watts |
| Pressure | 2.25 | mTorr |
| Temperature | 400 | C. |
| SiH4 flow | 150 | sccm |
| N2 flow | 14000 | sccm |
| NH3 | 750 | sccm |

Figure 2C:
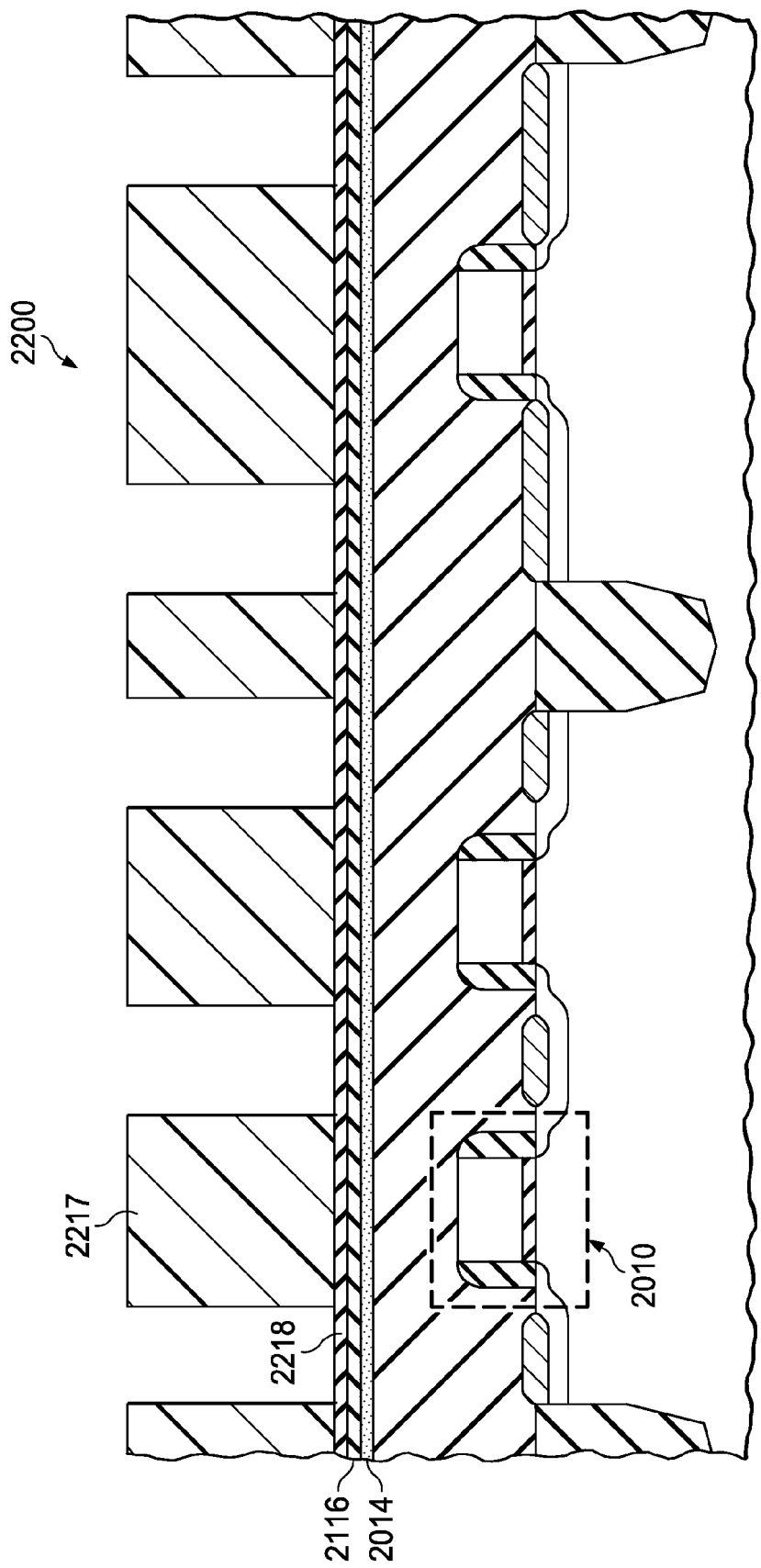

As shown in FIG. 2C, the optional capping layer of an oxide film (2218) is formed on the integrated circuit (2200). Next, a contact photoresist pattern (2217) is formed on top of the oxide film (2218). In this embodiment, the oxide film (2218) may prevent an adverse reaction (e.g. resist poisoning) between the residual $NH_3$ that may be present in the PECVD SiNxHy hydrogen barrier film (2116) and the contact photoresist pattern (2217). The adverse reaction may interfere with the patterning and development of the photoresist and it may also interfere with the photoresist removal process.

Figure 2D:
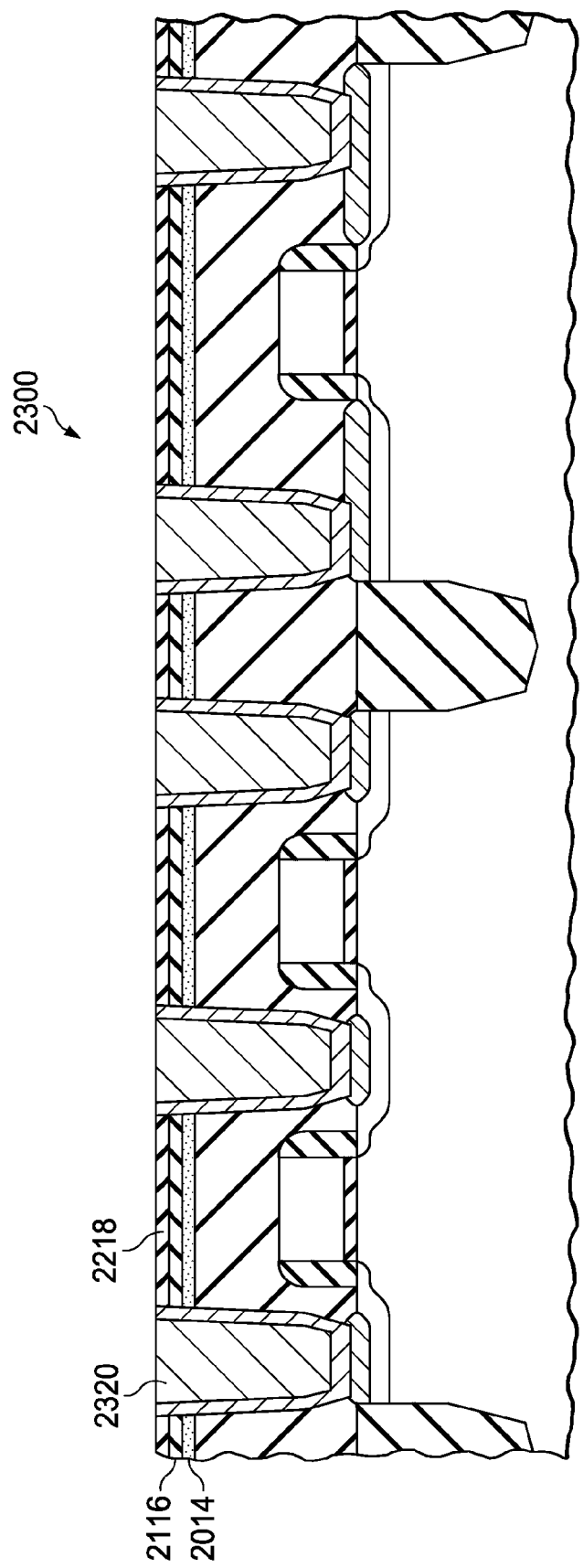

FIG. 2D shows the integrated circuit (2300) after contacts (2320) have been formed using conventional processing. Note that the contact etch may be modified to etch the hydrogen releasing (2014) and the hydrogen barrier (2116) SiNxHy films.

Figure 2E:
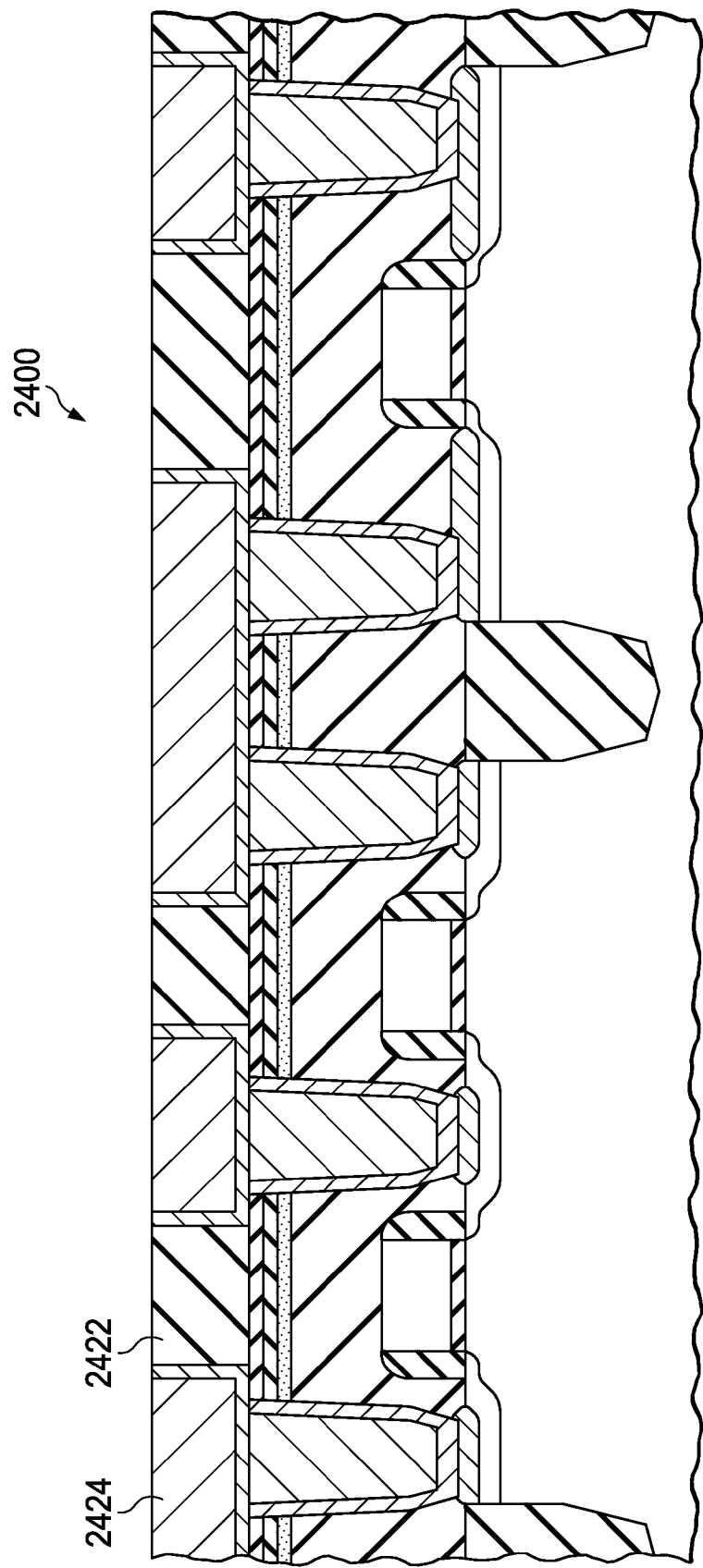

Additional backend processing may be performed, as shown in FIG. 2E, to add a first level interconnects (2424). A first inter-metal dielectric layer ("IMD-1") (2422) electrically insulates the first level interconnects ("metal-1") (2424). IMD-1 (2422) may be any suitable dielectric such as a PECVD oxide or a low-k dielectric. The first level interconnects (2424) may be a metal such as copper or an aluminum-copper alloy. Additional processing steps to add additional levels of dielectric and interconnects may be performed to complete the integrated circuit. With this example embodiment, the backend passivation anneal that is currently commonly used as one of the final processing steps in CMOS process flows may be omitted.

It is to be noted that although transistors were shown in FIGS. 2A-2E to illustrate the embodiment, other components such as memory cells (SRAM, DRAM, FLASH, FRAM, etc.), resistors, capacitors, analog components, and high voltage components may also benefit using this embodiment. Moreover, the substrate (2002) of the example embodiment is bulk silicon substrate, but other substrates such as silicon-on-insulator may alternatively be used.

The example embodiment described supra with reference to FIGS. 2A-2E utilizes a hydrogen releasing film (2014). In yet another embodiment, the hydrogen releasing film is omitted, but a hydrogen or deuterium anneal, or a forming gas anneal containing hydrogen or deuterium, is used to passivate the integrated circuit prior to the deposition of the passivation trapping layer (2116). Using this embodiment the passivation anneal that is currently commonly used as one of the final processing steps in CMOS process flows may be omitted.

Figure 3A:
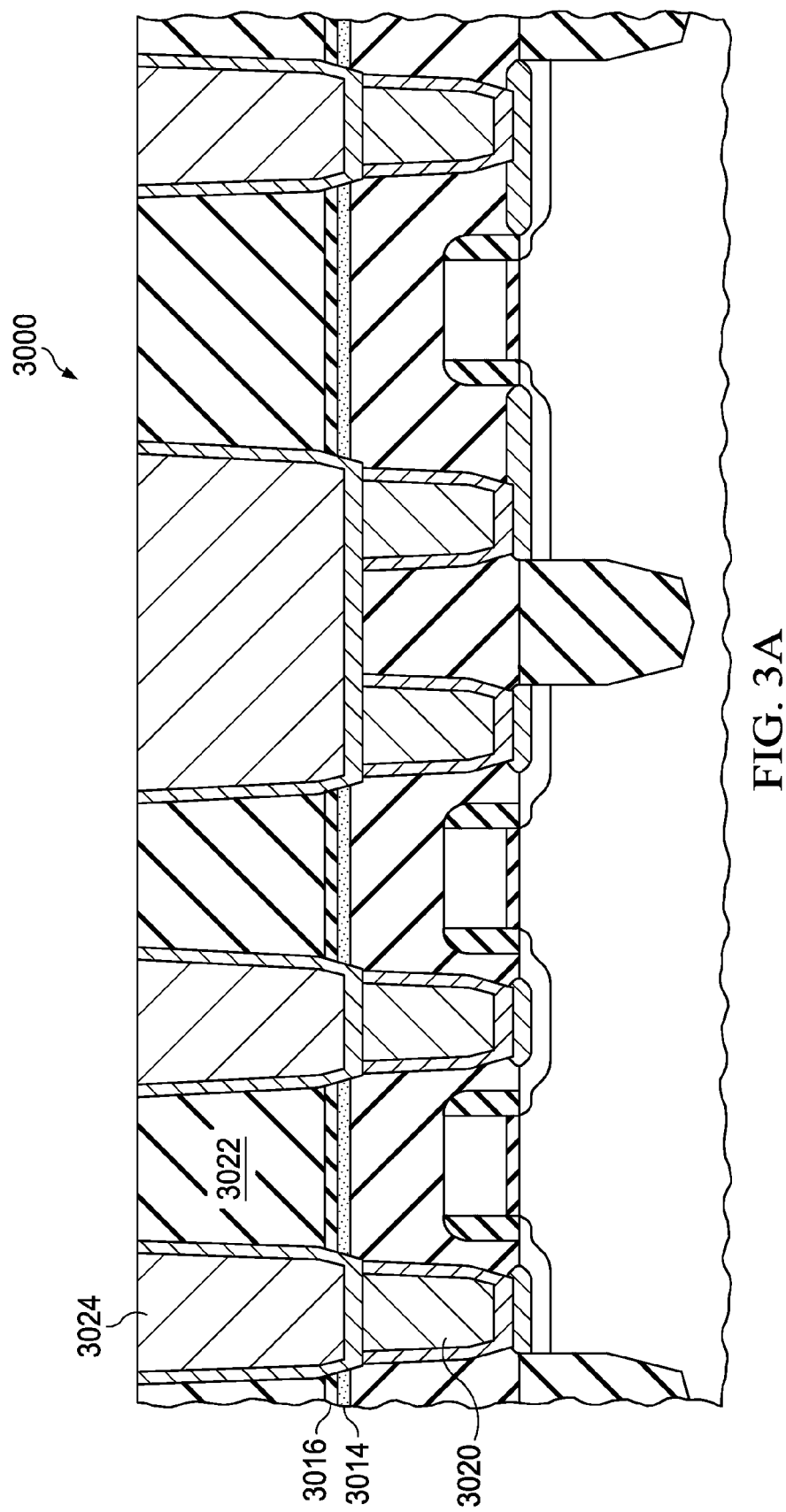
FIGS. 3A through 3B illustrate an integrated circuit according to other embodiments.
Figure 3B:
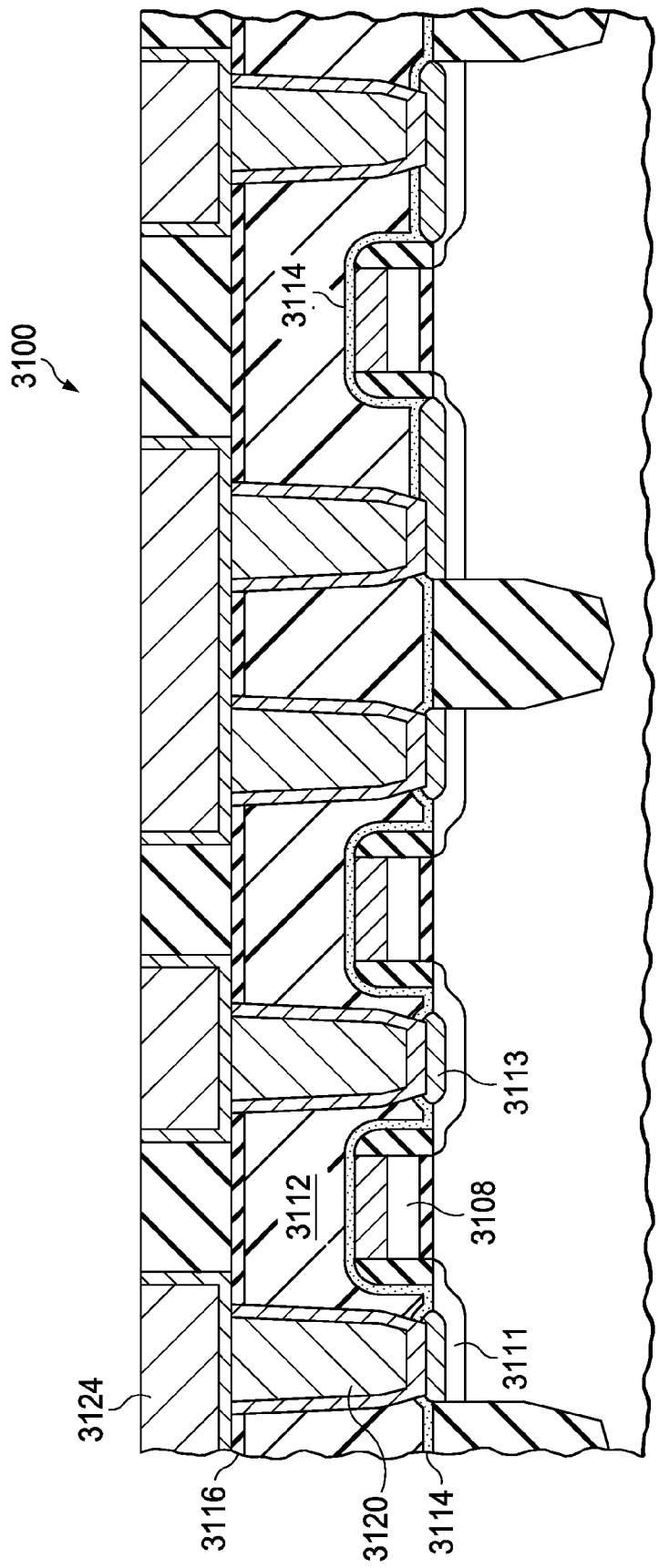

In the above embodiment, the hydrogen releasing film is deposited over the planarized PMD dielectric layer subsequent to transistor formation and prior to contact photoresist patterning. However, the passivation step and the deposition of the optional overlying hydrogen barrier film may occur at other points in the process flow, as illustrated in FIGS. 3A and 3B. In FIG. 3A, the hydrogen releasing film (3014) and the hydrogen barrier film (3016) (plus an oxide film (not shown), if used) are deposited over the integrated circuit (3000) after the contacts (3020) have been formed. In this embodiment, the (passivating) hydrogen releasing film (3014) and the (passivation trapping) hydrogen barrier film (3016) also may function as etch stop layers for the metal-1 (3024) etch process. Moreover, the metal-1 dielectric material (3022) may also be a hydrogen barrier material, such as TiN or TaN. Even though openings for metal-1 interconnections (3024) have been etched through the hydrogen barrier layer (3016) to enable metal-1 (3024) to make the desired electrical connection to the contacts (3020), the combination of the metal-1 dielectric material (3022) and the hydrogen barrier layer (3016) may still function as a substantially continuous hydrogen barrier over the integrated circuit (3000).

In FIG. 3B, the hydrogen releasing layer (3114) is deposited over the integrated circuit (3100) after the formation of the sources and drains (3111) and the transistor gates (3108), and also after the optional silicidation (3113) of the sources and drains (3111). The hydrogen releasing layer (3114) may passivate the integrated circuit (3100). The hydrogen releasing layer (3114) may also function as a contact etch stop layer in this embodiment. After the deposition and planarization of the PMD layer (3112), the hydrogen diffusion barrier layer (3116) is deposited (along with the optional oxide capping layer (not shown), if used). The hydrogen diffusion barrier layer (3116) functions as a passivation trapping layer. Next, the contacts (3120) are formed and the first level of interconnect, metal-1 (3124), is formed over the contacts (3120). Alternatively, the hydrogen diffusion barrier layer (3116) may be deposited directly on top of hydrogen releasing layer (3114) in the embodiment shown in FIG. 3B, or it may be deposited after contact (3120) formation and then used as an etch stop for the metal-1 (3124) etch.

Figure 4A:
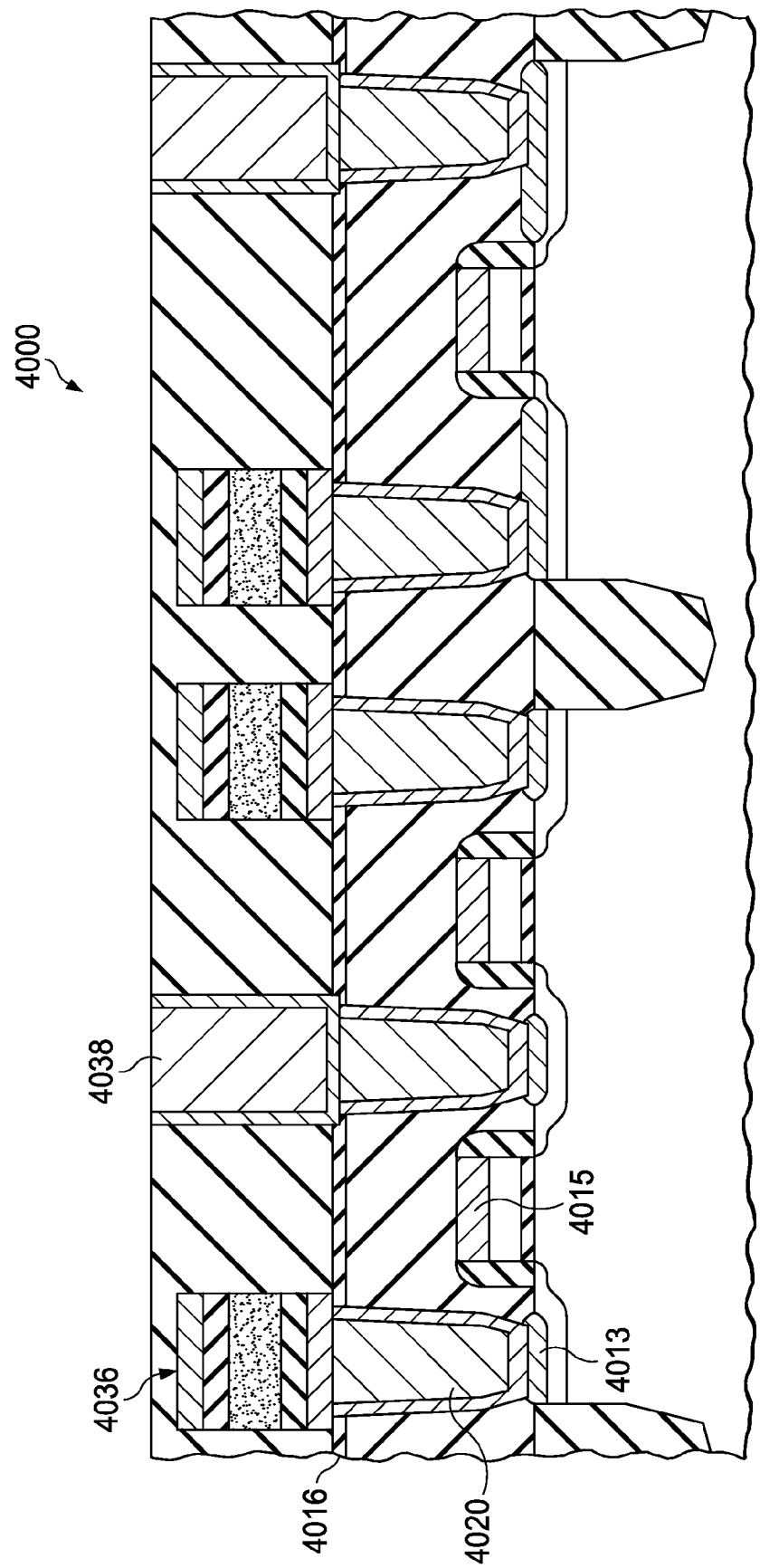
FIGS. 4A through 4C illustrate an integrated circuit according to alternative embodiments.
Figure 4B:
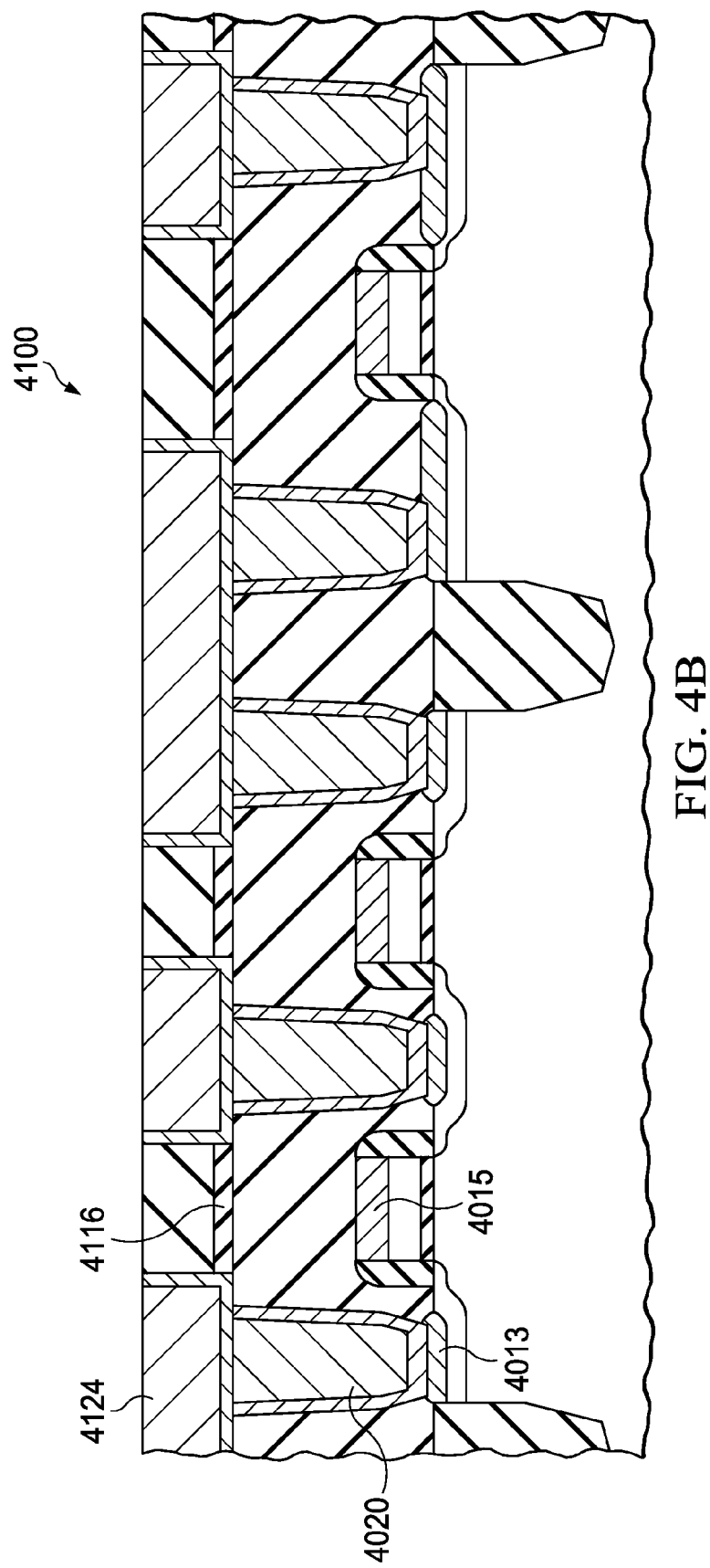
Figure 4C:
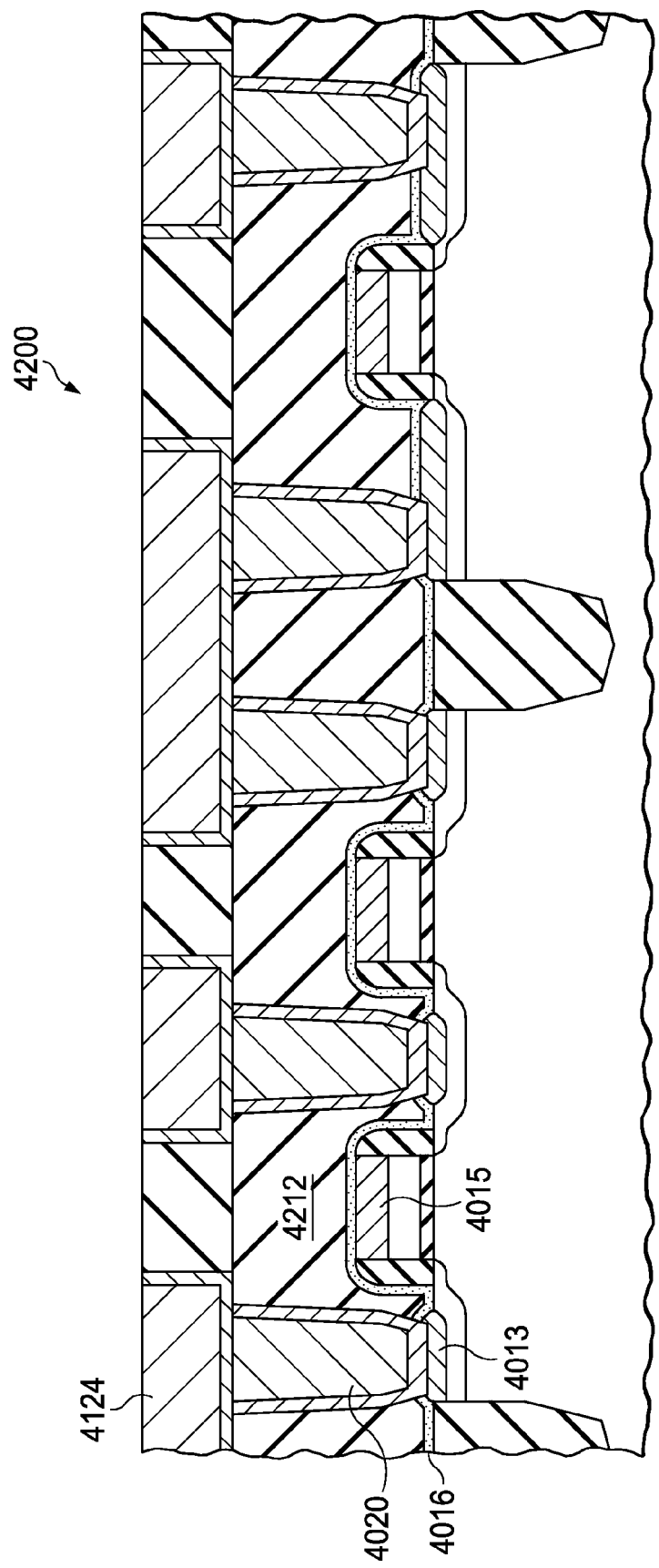

The hydrogen releasing film (3114) and the hydrogen barrier film (3116) may be deposited at other points in the integrated circuit manufacturing flow and also be within the scope of the present invention. Some of these other embodiments are illustrated in FIGS. 4A, 4B, and 4C. In these embodiments, (4000), (4100) and (4200), the hydrogen releasing layer is omitted. Therefore, in the embodiments illustrated in FIGS. 4A, 4B, and 4C, the integrated circuit may or may not be passivated prior to a deposition of a passivation trapping layer (4016). For embodiments where the integrated circuit is passivated prior to the deposition of the passivation trapping layer (4016), the integrated circuit may be passivated through an exposure to a high density plasma ("HDP") containing hydrogen or deuterium, or alternatively to a hydrogen or deuterium anneal at 350° C. or more. The hydrogen or deuterium containing HDP plasma is used in the best mode of the example embodiments because the HDP plasma usually generates reactive H and D radicals that are especially effective at passivating interface states and crystal defects.

In FIG. 4A, the HDP passivation is performed after the formation of the source and drain silicide (4013) and the gate silicide (4015) but prior to the deposition of the passivation tapping layer (4016). In this embodiment, the passivation trapping layer (4016) is deposited before the contact (4020) patterning step. If the passivation trapping layer (4016) is SiNxHy then an optional oxide capping layer (not shown) may be deposited on top of the passivation trapping layer (4016) prior to contact patterning (to avoid photoresist poisoning due to residual $NH_3$ in the SiNxHy). In this example embodiment, the FeCaps (4016) and the second contacts (4038) are formed over the passivation trapping layer (4016).

In FIG. 4B, the passivation step is also performed after the formation of the source and drain silicide (4013) and the gate silicide (4015) but prior to the deposition of the passivation trapping layer (4116). In this embodiment the passivation trapping layer is deposited after the formation of the contacts (4020) but before the formation of the metal-1 interconnects (4124).

In FIG. 4C, the passivation step is also performed after the formation of the source and drain silicide (4013) and the gate silicide (4015) but prior to deposition of the passivation trapping layer (4016). However, in this embodiment the passivation trapping layer is deposited before the deposition of the PMD dielectric (4212). The passivation trapping layer in this embodiment may also function as an etch stop layer for the contact (4020) etch step.

In the embodiments shown and described in FIGS. 4A through 4C, a passivation trapping layer is deposited over the integrated circuit after the hydrogen or deuterium from a 350° C. (or higher) anneal—or from an HDP plasma—passivates the interface and crystal defects. The passivation barrier film is deposited to prevent the hydrogen or deuterium from diffusing away from the transistor interfaces during subsequent thermal processing steps.

Figure 5:
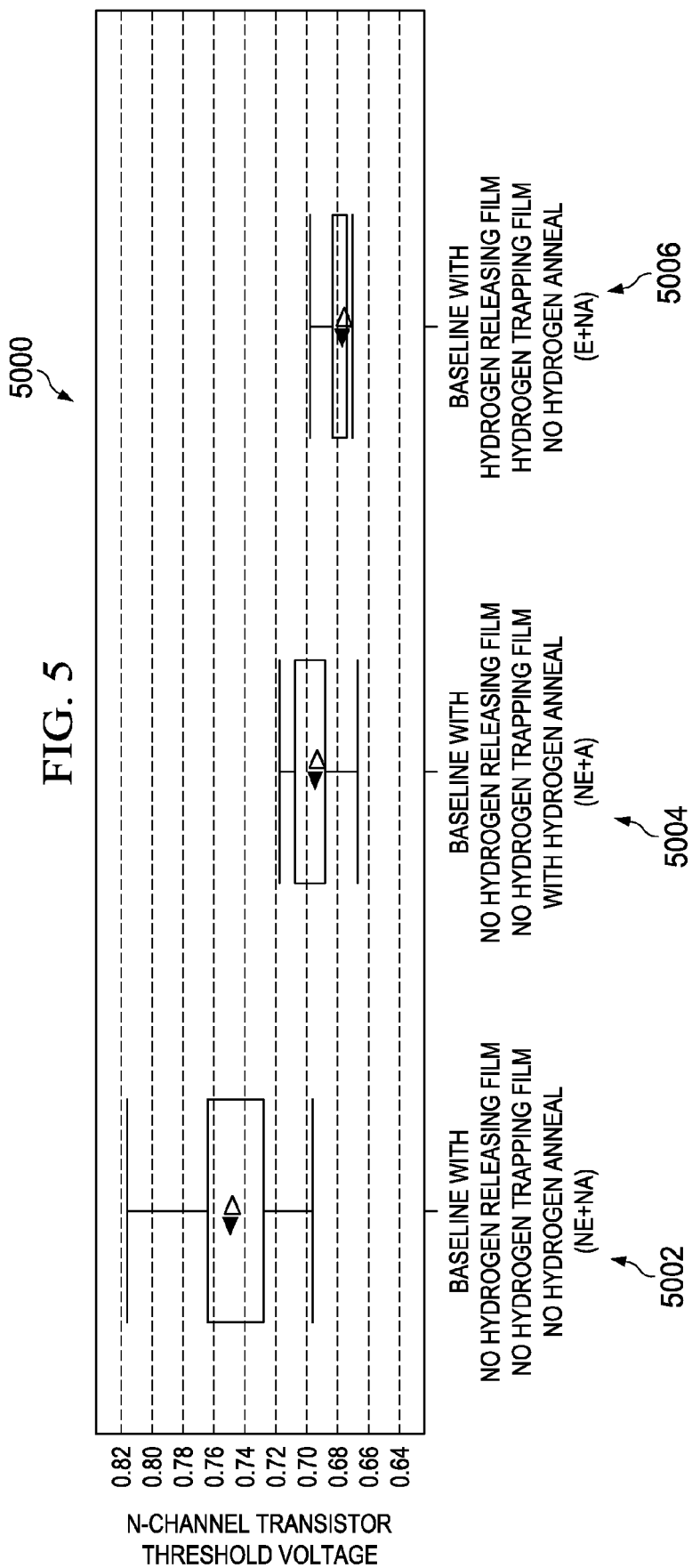
FIG. 5 compares the transistor threshold voltage ($V_t$) of transistors that are formed according to an example embodiment to the $V_t$ of transistors that are not formed according to the example embodiment.

FIG. 5 shows illustrates the spread threshold voltages ("$V_t$'s") for example n-channel 3.3 Volt transistors processed with no hydrogen passivation anneal (5002), n-channel 3.3 Volt transistors processed with a conventional end-of-process 400° C. hydrogen passivation anneal (5004), and n-channel 3.3 Volt transistors processed with a hydrogen releasing film plus a passivation trapping layer (HDP deposited prior to contact patterning) (5006). As shown in FIG. 5, the $V_t$ of the transistors formed with no passivation anneal (5002) is about 0.75 Volts, compared to the $V_t$ of the transistors formed with a hydrogen releasing film plus a passivation trapping layer (5006) of about 0.68 Volts. Therefore, a process that forms transistors with a hydrogen releasing film plus a passivation trapping layer may passivate a significant portion of the interface change ("$Q_{it}$"), thereby causing a lowering of the $V_t$.

The electrical data illustrated in FIG. 5 also shows that the spread in $V_t$'s for transistors formed with no passivation anneal (5002) is larger (i.e. ~0.12 Volts) than the spread in $V_t$'s for transistors formed with a hydrogen releasing film plus a passivation trapping layer (5006) (i.e. ~0.03 Volts). Therefore, the uniformity in transistor $V_t$'s has been significantly improved for transistors formed with a hydrogen releasing film plus a passivation trapping layer. Moreover, a comparison of the $V_t$ (~0.68 Volts) and $V_t$ spread (0.03 Volts) of transistors formed with a hydrogen releasing film plus a passivation trapping layer (5006) to a baseline sinter process of transistors processed with a conventional end-of-process 400° C. hydrogen passivation anneal (5004) with the $V_t$ (~0.69 Volts) and $V_t$ spread (0.05 Volts) shows that the transistors formed with a hydrogen releasing film plus a passivation trapping layer (5006) may be an improvement over the baseline sinter process (5004).

As noted supra, deuterium may also be used instead of hydrogen for the passivation steps of the disclosed embodiments. For example, $SiD_4$ may be used instead of $SiH_4$ in the formation of the hydrogen releasing film. Alternatively, a deuterium-containing gas may be added to the HDP during the formation of the hydrogen releasing film. Deuterium usually forms a more stable bond with silicon than hydrogen; therefore, deuterium may improve $V_t$ stability (e.g. the $V_t$ distribution) over time. The use of deuterium instead of hydrogen in the disclosed embodiments may provide a more cost effective method of passivation than conventional furnace deuterium anneals because the chamber volume is much smaller, the reaction pressure is much lower, the deuterium concentration is much lower, and the process time is much reduced in a single wafer plasma process (in comparison to a batch furnace deuterium anneal process).

The example process deposition conditions are given for 8-inch deposition equipment. One skilled in the art may use these 8-inch recipes as a guide for developing an equivalent process on a 12-inch (or larger diameter) tool.

While various embodiments have been described above, it should be understood that they have been presented by way of example only and not limitation. Numerous changes to the disclosed embodiments can be made in accordance with the disclosure herein without departing from the spirit or scope of the embodiments. Thus, the breadth and scope of the embodiments should not be limited by any of the above-described embodiments. Rather, the scope of the embodiments should be defined in accordance with the following claims and their equivalents.

What is claimed is:

1. A process of forming an integrated circuit, comprising:
   providing a partially processed integrated circuit that includes a transistor;
   passivating said partially processed integrated circuit;
   after said passivating step, depositing a passivation trapping layer over said transistor;
   forming a pre-metal dielectric (PMD) layer over said passivation trapping layer; and
   after the step of forming said PMD layer, etching at least one contact opening through said PMD layer and said passivation trapping layer to contact said transistor;
   wherein said at least one contact opening is located laterally adjacent to a gate of said transistor.

2. The process of claim 1 where said passivating step is a HDP process including at least one of hydrogen and deuterium.

3. The process of claim 1 where said passivating step is depositing at least one of a hydrogen releasing layer and a deuterium releasing layer.

4. The process of claim 3 where said hydrogen releasing layer is a HDP SiNxHy film with more Si—H bonds than N—H bonds.

5. The process of claim 3 where said deuterium releasing layer is a HDP SiNxDy film with more Si-D bonds than N-D bonds.

6. The process of claim 1 where said passivating step is annealing said integrated circuit in at least one of a hydrogen and a deuterium containing ambient.

7. The process of claim 1 where said passivation trapping layer is a film selected from the group consisting of:
   AlO,
   AlON,
   SiNx, and
   SiNxHy.

* * * * *